United States Patent [19]

Enoki et al.

[11] Patent Number: 4,995,063
[45] Date of Patent: Feb. 19, 1991

[54] SINGLE CRYSTAL ORIENTATION IDENTIFYING AND DETERMINING APPARATUS FOR SEMICONDUCTOR WAFER AND ITS OPERATION METHOD

[75] Inventors: Shigeo Enoki; Kenichi Okamura, both of Annaka, Japan

[73] Assignee: Shin-Etsu Handotai Company, Ltd., Tokyo, Japan

[21] Appl. No.: 466,184

[22] Filed: Jan. 17, 1990

[30] Foreign Application Priority Data

Jan. 20, 1989 [JP] Japan ................ 1-9997

[51] Int. Cl.⁵ ............ G01N 23/20; B65H 1/00; B65G 29/00
[52] U.S. Cl. ........................ 378/70; 378/73; 414/225; 414/433
[58] Field of Search ............. 378/73, 70; 414/225, 414/433

[56] References Cited

U.S. PATENT DOCUMENTS

| | | | |
|---|---|---|---|
| 4,662,811 | 5/1987 | Hayden | 414/433 |
| 4,695,215 | 9/1987 | Jacoby et al. | 414/225 |
| 4,710,259 | 12/1987 | Howe et al. | 378/73 |
| 4,819,167 | 4/1989 | Cheng et al. | 414/225 |
| 4,846,626 | 7/1989 | Engelbrecht | 414/225 |
| 4,892,455 | 1/1990 | Hine | 414/433 |
| 4,911,597 | 3/1990 | Maydan et al. | 414/225 |
| 4,938,654 | 7/1990 | Schram | 414/225 |

Primary Examiner—Constantine Hannaher
Assistant Examiner—Kim-Kwok Chu
Attorney, Agent, or Firm—Lowe, Price, LeBlanc, Becker & Shur

[57] ABSTRACT

A single crystal orientation identifying and determining apparatus for semiconductor wafers capable of conducting the facial discrimination of a semiconductor wafer and the determination of the crystal orientation thereof, which comprises a first wafer store; an alignment device for aligning the wafer in a predetermined orientation; an X-ray inspection device for inspecting the wafer as to whether or not the inspected face of the wafer is a predetermined particular face, and whether or not the orientation of the principal plane of the wafer is within a predetermined range, said X-ray detector, and X-ray detector, and an X-ray inspection stage; a second wafer store; a first conveyor for conveying the wafer from the first wafer store to the alignment device; a second conveyor for conveying the wafer form the alignment device to the X-ray inspection device, and a third conveyor for conveying the wafer from the X-ray inspection device to an arbitrary address in the second wafer store determined based on the result of the X-ray inspection and the wafer's address in the first wafer store.

8 Claims, 5 Drawing Sheets

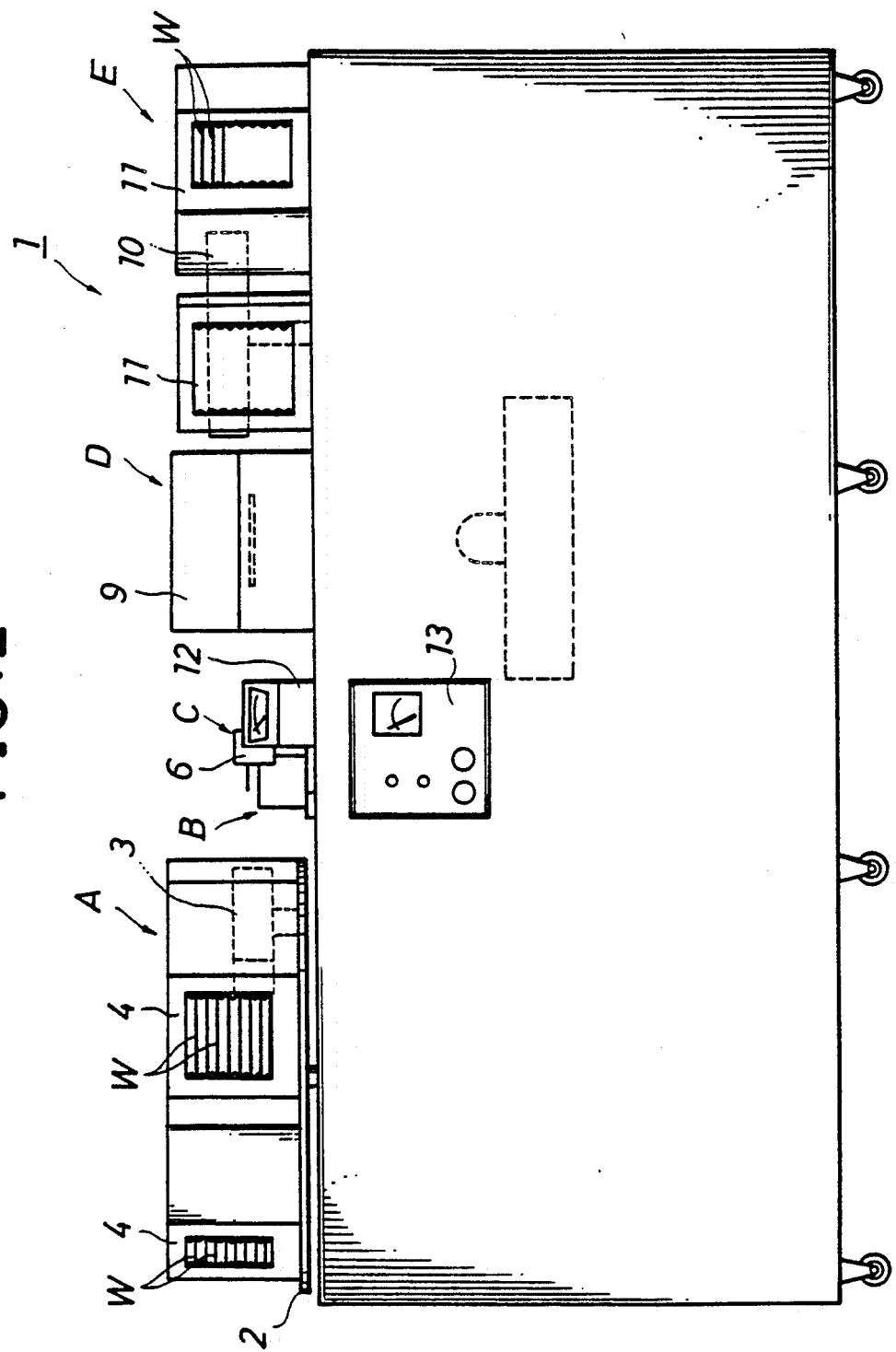

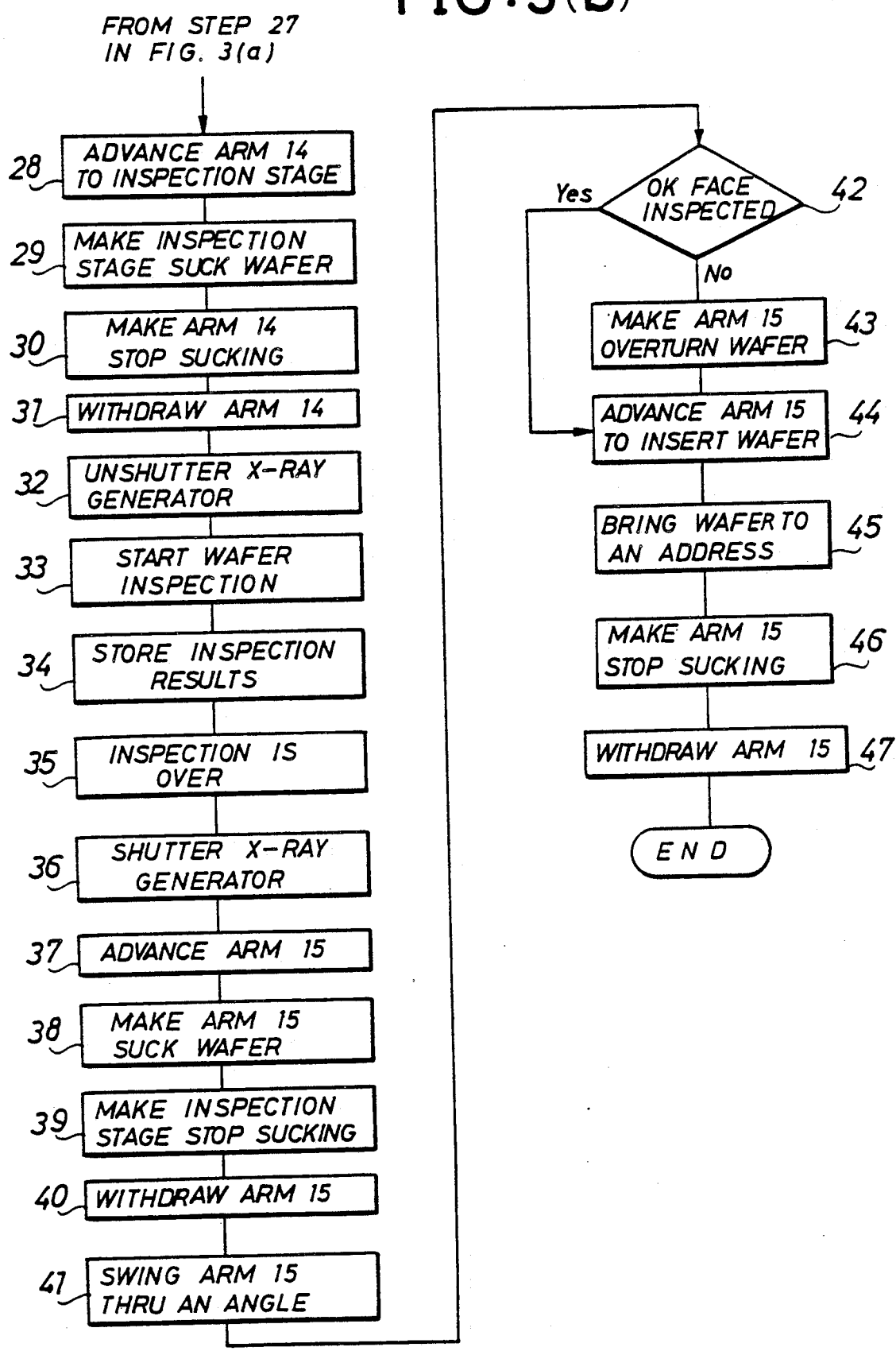

SINGLE CRYSTAL ORIENTATION IDENTIFYING AND DETERMINING APPARATUS FOR SEMICONDUCTOR WAFER AND ITS OPERATION METHOD

Technical Field

The present invention relates generally to an apparatus for automatically inspecting a single crystal semiconductor wafer by means of X-ray irradiation to conduct not only the facial identification (discrimination) thereof but also the determination of the crystal orientation thereof. Also, the present invention relates to the methods of operating such apparatuses.

BACKGROUND ART

Silicon single crystal semiconductor wafers are sliced from a silicon single crystal semiconductor rod (ingot) and are subjected to various treatments such as thermal oxidation in the device manufacturing process. However, these treatments are liable to cause crystal defects (plane defect) in the surfaces of the wafers. To avoid this problem, Japanese Patent Publication (Kokoku) No. 50-182 teaches that the sliced surface of a silicon single crystal wafer should be oriented such that the sliced surface makes a slight off-angle (2.5 to 15 degrees) with the nearest 100 plane of the crystal.

Hence, a semiconductor wafer thus is caused to have distinctive faces, and only a particular one of the two faces is polished and receives other treatments, so that it becomes necessary to conduct a facial discrimination of the semiconductor wafer, which is not possible by visual examination.

Conventionally, for the purpose of enabling one to visually distinguish the particular face of the wafer from the other face, each semiconductor wafer sliced from a silicon single crystal rod (ingot) is provided with two dissimilar orientation flats (hereinafter only referred to as "OF"), or each semiconductor wafer is provided with notches, a laser mark, or the like which enables one to tell one face from the other of the wafer.

Also, since the direction of and the absolute value of the off-angle of the principal plane (sliced surface) of the semiconductor wafer are required to be within respective predetermined ranges, it is necessary to determine the crystal orientation as well a discriminate the faces of the semiconductor wafer.

However, with the conventional methods of discriminating between the faces of a semiconductor wafer, it is necessary to give physical marking to the wafer which requires expensive marking apparatuses, and thwarts an attempt to totally automatize the discrimination operation for rationalization.

Also, in the conventional practices, the examination and determination of whether or not the off-angle of the principal plane (sliced surface) of the wafer is within the predetermined range was carried out only as the single crystal rod (ingot) is sliced into wafers, and after the slicing, the examination and determination was conducted only with a few sample wafers taken from each lot (consisting of semiconductor wafers from the same single crystal ingot) so that in reality most of the wafers were not inspected. Hence the occurrence of out-of-specification wafers was relatively frequent.

As described so far, the inspection of the semiconductor wafers are conducted during or at the end of the processing of the wafers, and there has been known no apparatus by which all of the wafers are automatically inspected for determination of the orientation of their principal planes.

The present invention was contrived in view of the foregoing problems, and an object of the invention is to provide an apparatus for automatically examining a semiconductor wafer to conduct not only the facial discrimination thereof but also the determination of the crystal orientation thereof with high efficiency and precision.

DISCLOSURE OF THE INVENTION

In order to attain this and other objects of the present invention, an automatic single crystal orientation identifying and determining apparatus (1) is provided for conducting not only the facial discrimination of a semiconductor wafer but also the determination of the crystal orientation thereof, which apparatus (1) comprises:

a first wafer store means (4) for storing wafers at different addresses, an alignment means (B) for aligning the wafer in a predetermined orientation, an X-ray inspection means (D) for inspecting the wafer as to whether or not the inspected face of the wafer is a predetermined particular face (facial discrimination), and whether or not the orientation of the principal plane of the wafer is within a predetermined range (determination of crystal orientation), said X-ray inspection means including an X-ray generator, an X-ray detector, and an inspection stage, a second wafer store means (11, 17) for storing X-ray inspected wafers at different addresses, a first conveyor means (3) for conveying the wafer from the first wafer store means (4) to the alignment means (B), a second conveyor means (6) for conveying the wafer from the alignment means (B) to the X-ray inspection means (D), and a third conveyor means (10) for conveying the wafer from the X-ray inspection means (D) to an arbitrary address in the second wafer store means (17) determined based on the result of the X-ray inspection and the wafer's address in the first wafer store means.

In a preferred embodiment, the third conveyor means (D) is adapted to overturn the wafer before conveying the wafer to the destination address int he second wafer store means (17) depending on the result of the X-ray facial discrimination.

In another preferred embodiment, the second wafer store means consists of two groups of addresses, one group being for storing those wafers whose polished faces are X-rayed, and the other group for storing those wafers whose unpolished faces are X-rayed.

In still another preferred embodiment, the apparatus (1) is designed to inspect the semiconductor wafer W provided with an orientation flat (OF) so that the alignment means (B) is an OF alignment means adapted to align the wafer in a predetermined orientation with the help of the OF.

In the last preferred embodiment, the semiconductor wafers to be inspected are set, one at a time, in the OF alignment means (B), and are aligned to orient in a predetermined direction with respect to the OF. The thus oriented semiconductor wafer is conveyed by the second conveyor means onto the inspection stage of the X-ray inspection means in a predetermined orientation, and an X-ray beam is emitted from the X-ray generator toward the inspected face of the wafer, by which the X-ray beam is reflected. In this inspection means, it is designed such that the X-ray diffraction condition is satisfied only when the inspected face of a semiconductor wafer has an off-angle of 4±1°, for example, from a predetermined plane (in the direction of <100> in the plane (100) at 45° to the OF), that is, when the lattice plane 400 in the semiconductor wafer forms an angle of from 3 to 5 degrees with the surface plane. Therefore, when the wafer being inspected has the right face exposed to the X-ray and this exposed face of the wafer has an off-angle within the predetermined range (3 to 5°), the X-ray detector detects the intense diffractive X-ray beam from the wafer surface. Thus, based on the intensity of the X-ray beam received by the X-ray detector, it is possible to determine whether the right face of the wafer is inspected, and whether the off-angle of the semiconductor wafer is within the predetermined range.

The semiconductor wafers which have been inspected of the facial discrimination and crystal orientation at the X-ray inspection means, are taken away from the inspection stage by the third conveyor means, and stored in the second wafer store means at an address and in a manner determined by the result of the inspection (e.g. if it is determined that the right face is inspection and the off-angle of the inspected face is within the permissible range, the wafer is stored without being turned over, and if the determination is that either the wrong face is inspected or the off-angle of the inspected face is not within the permissible range, the wafer is stored after being turned over).

Therefore, the X-ray inspection of facial discrimination and the crystal orientation determination is continuously conducted with respect to all of the semiconductor wafers, so that no wafer is brought to the later process without being inspected for the crystal orientation, and it is possible to carry out the inspection fully automatically with high efficiency and precision. As a result, the occurrence of out-of-specification wafers is minimized.

In the case of a wafer having off-orientation in its principal plane and having distinctive faces, it is possible to determine whether or not off-orientation exists in the principal plane by employing a plurality of X-ray inspection means in which the X-ray optical system comprises the incident X-ray and the reflected X-ray that satisfy the Bragg diffraction condition with each other.

BRIEF DESCRIPTION OF DRAWINGS

FIG. 2 is a side view of the apparatus shown in FIG. 1.

BEST MODE FOR CARRYING OUT THE INVENTION

An embodiment of the present invention will be described with reference to the attached drawings.

Figure 1:
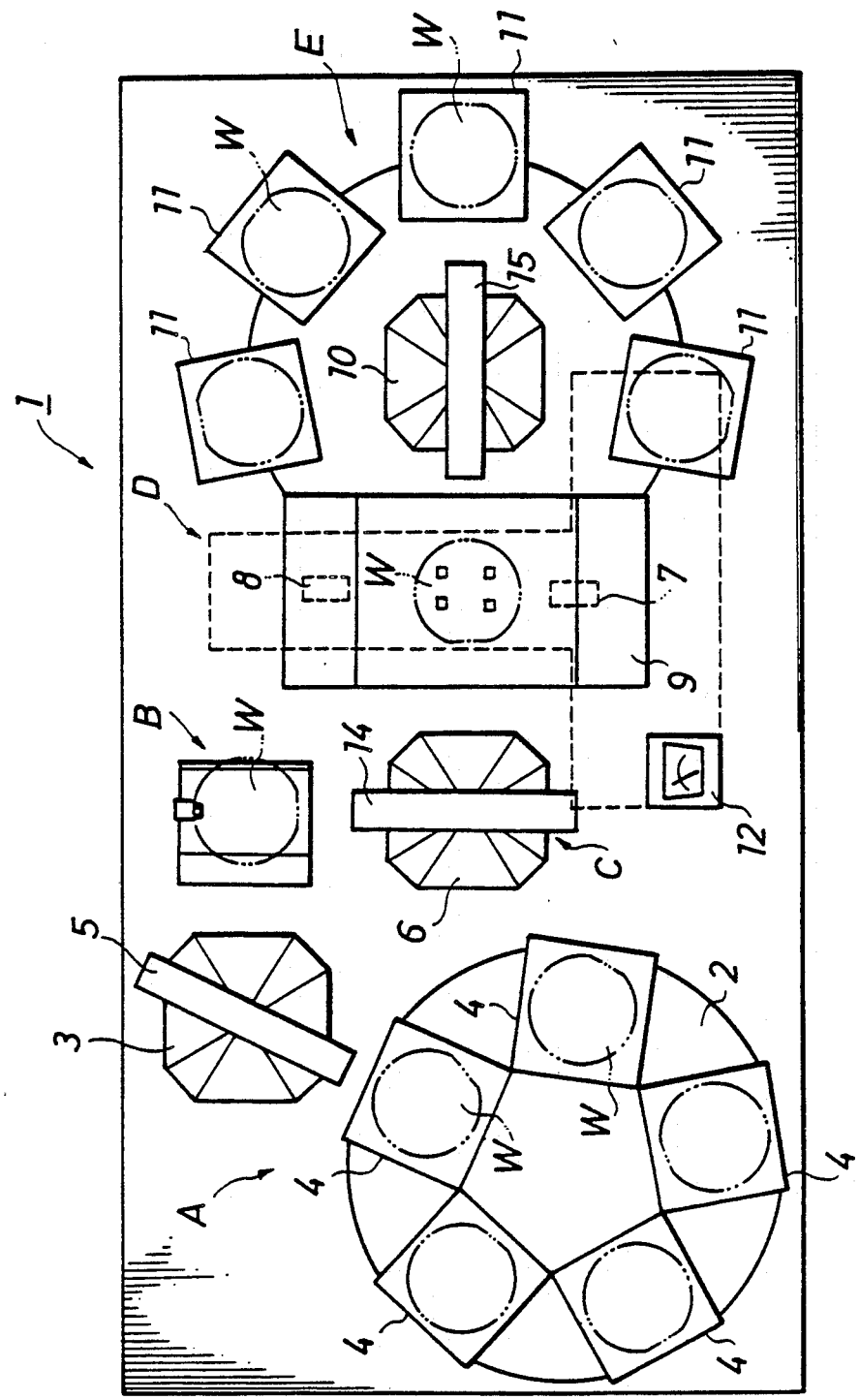
FIG. 1 is a plan view of an embodiment of the single crystal orientation identifying and determining apparatus for semiconductor wafer, according to the present invention.

As shown in FIGS. 1 and 2, a single crystal orientation identifying and determining apparatus for semiconductor wafer 1 is mainly composed of a loader assembly A, an OF alignment assembly B, a transportation C, an inspection assembly D, and an unloader assembly E.

The loader assembly A consists of a turn table 2 and a robot 3. The turn table 2 is capable of turning horizontally about the central axis driven by a drive means, not shown. The turn table 2 is equipped with five cassettes 4, each of which 4 has twenty-five racks of different addresses and can contain twenty-five silicon single crystal semiconductor wafers W. The wafers are horizontally inserted int he racks of the cassettes 4, and forms a vertical stack of wafers in each cassette 4 with a vertical gap provided between the neighboring wafers. The robot 3 has an arm 5 which is capable of moving vertically, horizontally, and pivotally about the axis of rotation. Provided at the end of this arm 5 is a wafer sucker made of quartz which is adapted to suck and hold a wafer W by means of vacuum suction, and is in communication with a vacuum suction means, not shown.

The OF alignment assembly B is adapted to orient the semiconductor wafer W in a predetermined orientation with the help of the OF (orientation flat), and is composed mainly of an OF stage for sucking and holding a wafer W horizontally onto the stage and turning the wafer W horizontally about its center, and an OF sensor for detecting the OF of the wafer W. Suction holes are made in the upper surface of the OF stage, and they communicate with the vacuum suction means, not shown. The transportation assembly C comprises a robot 6 similar to the robot 3, equipped with an arm 14.

The inspection assembly D is mainly composed of an inspection stage where a semiconductor wafer W is sucked and fixed for inspection, and a stationary type special X-ray optical system, which comprises an X-ray generator 7, an X-ray detector 8, a goniometer, a shutter detector, etc. The upper portion of the inspection assembly D is covered with an X-ray protection cover 9. Incidentally, the wafer W is positioned on the inspection stage horizontally with the lower surface exposed to the X-ray generator 7 and the X-ray detector 8, which are arranged such that the optical center lines of the two devices 7 and 8 are in the same plane vertical to the inspected wafer W, and the X-ray beam emanated from the X-ray generator 7 is directed tot he lower surface (inspection face) of the wafer W at a predetermined incident angle, and the X-ray detector 8 stares the same surface of the wafer W from a predetermined angle. The inspection stage is pneumatically in communication with the vacuum suction means, not shown.

The unloader assembly E is composed mainly of a robot 10 equipped with an arm 15, similar to the robots 3 ad 6, and five cassettes 11 arranged equidistant from and in a circular row about the robot 10. These cassettes 11 are of the same construction as the cassettes 4, so that each cassette 11 can contain a stack of up to twenty-five wafers W. In the figures, reference numerals 12 and 13 designate an X-ray meter and a control panel, respectively.

In the present embodiment, a semiconductor wafer W is designed such that i has an off-angle of 4° in the <100> direction, which is 45° from the OF.

Next, the procedure of conducting the facial discrimination and the crystal orientation determination of the semiconductor wafer W will be described with reference to the process flow chart of FIG. 3.

First, the power source switch of the semiconductor wafer orientation examining and determining apparatus 1 is turned on (step 1 in the flow chart of FIG. 3). Then, a start-up check is effected which comprises the determination of whether or not all of the doors of the apparatus 1 are closed (step 2) and whether or not the cover 9 is closed (step 4). If the answer to the question at step 2 is negative (No), that is, if any of the doors is not closed yet, a "CHECK DOORS" sign, not shown, is lit up to warn the operator (step 3), and the loop of step 2 and step 3 is repeated till the answer to step 2 becomes affirmative. When the answer to the question at step 2 is affirmative (Yes), the "CHECK DOORS" sign is put out (step 3), and the program proceeds to step 4. If the answer at step 4 is No, that is, if the cover 9 is not in the predetermined closed position, a "CHECK COVER" sign, not shown, is lit up (step 5), and the loop of step 4 and step 5 is repeated till the cover 9 is closed appropriately.

If the answer to the question at step 4 is Yes, the "CHECK COVER" sign is put out (step 5), and the X-ray generator 7 is turned on (step 6), and the program proceeds to step 7 whereupon the turn table 2 is horizontally turned so as to bring one of the cassettes 4 containing the wafers W to be examined into the predetermined indexed position. At the next step 7 it is determined whether or not one of the cassettes 4 has arrived in the indexed position. The turning operation of the turn table 2 is continued until the answer to step 8 becomes affirmative. When the answer at step 8 is Yes, the turn table 2 is stopped (step 9), and the program proceeds to step 10 to cause the robot 3 to insert its arm 5 into the lowest rack of the cassette 4 which is in the indexed position. Then the arm 5 is raised by a predetermined elevation (step 11), and it is determined whether or not a wafer W exists in the rack by detecting the vacuum pressure at the end of the arm 5(step 12). If the answer is No, the program reverts to step 11 and the arm 5 is further raised by the predetermined elevation. This loop is repeated until existence of a wafer W is determined int he cassette 4. (However, if no wafer W exists in the cassette 4, then the arm 5 is withdrawn and the turn table 2 is turned again so that a different cassette 4 comes to the indexed position and the steps 10 and 11 are executed, the program for which is omitted from the flow chart of FIG. 3 for simplicity.)

Now, if the answer at step 12 turns Yes, that is, if the arm 5 detects a wafer W in the cassette 4, the next step 13 is executed to increase the suction strength of the wafer sucker at the end of the arm 5 whereby the arm 5 holds the wafer W at the wafer sucker and, the robot 3 withdraws the arm 5 from the cassette 4 (step 14).

Then the arm 5 is swung through a predetermined angle in a predetermined direction about the axis of rotation (step 15), which brings the wafer W close to the OF stage of the OF alignment assembly B, and the swinging of the arm 5 is stopped. Next, the robot 3 advances it arm 5 until the wafer W held on the arm 5 is placed slightly over the middle portion of the OF stage (step 16). Then the OF stage is pneumatically connected to the vacuum suction means so as to start sucking the wafer W (step 17), and almost simultaneously as this, the wafer sucker of the robot arm 5 is pneumatically disconnected from the vacuum suction means so that the wafer sucker stops pulling the wafer W (step 18) whereby the wafer W is snatched by the OF stage from the arm of the robot 3.

The arm 5 is withdrawn (step 19). Then the OF alignment assembly B start orienting the wafer W. The OF stage is turned about the axis of rotation until the OF sensor detects the OF of the wafer W at the predetermined orientation (steps 20, 21, 22). Thus, the wafer W is oriented with respect to its OF.

Figure 3A:
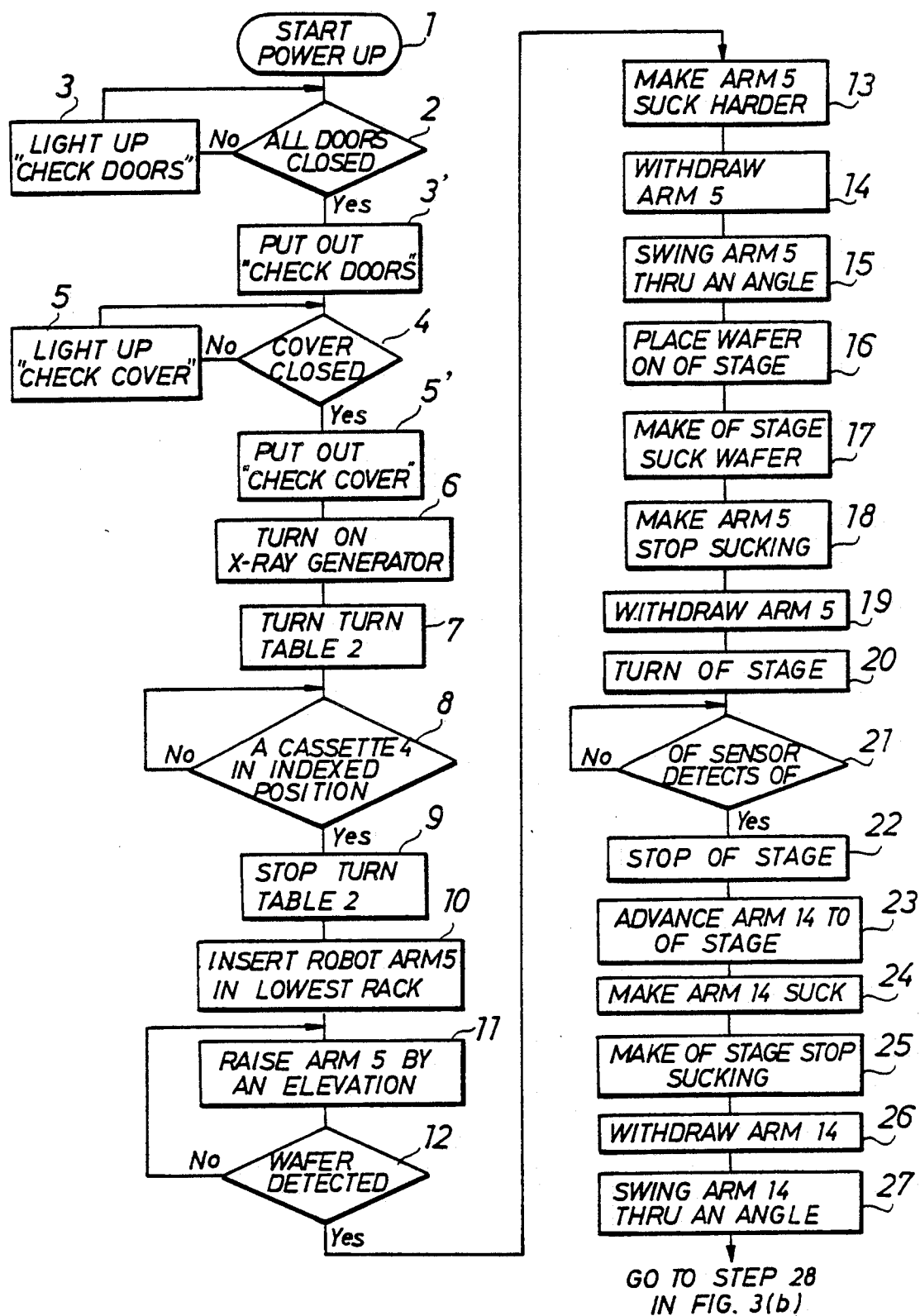
FIG. 3(a) is the first half of a process flow chart showing the operation procedure for conducting facial to complement the first half thereof shown in FIG. 3(a).

In synchronism with the affirmative determination at step 21, a separate program is commencrf which consists of steps 10 through 47 of FIGS. 3(a) and 3(b), so that more than two wafers can be served by the apparatus 1 at a time.

When the orientation of the wafer is finished, the robot 6 of the transportation assembly C advances its arm 14 toward the wafer W on the OF stage (step 23), and the wafer sucker at the arm end is pneumatically connected to the vacuum suction means (step 24), and the OF stage is disconnected from the vacuum suction means (step 25) whereby the wafer W is snatched by the robot 6 from the Of stage and of the OF alignment assembly B. Then, the arm 14 is withdrawn and swung through a predetermined angle in a predetermined direction about the axis of rotation (steps 26, 27), which brings the wafer W close to the inspection stage of the inspection assembly D, and the swinging motion of the arm 14 is stopped. Next, the robot 6 advances its arm 14 until the wafer W held on the arm 14 is placed on the middle portion of the inspection stage (step 28). Then the inspection stage is pneumatically connected to the vacuum suction means so as to start sucking the wafer W (step 29). Almost simultaneously as this, the wafer sucker of the robot arm 14 is pneumatically disconnected from the vacuum suction means so that the wafer sucker stops pulling the wafer W (step 30), and the arm 14 is withdrawn (step 31). Thus the wafer W is pneumatically held on the inspection stage.

Next, the shutter of the X-ray generator 7 of the inspection assembly D is opened (step 32), and the facial discrimination and the crystal orientation determination of the wafer W lying on the inspection stage is commenced (step 33). The principles of the inspection procedure based on the X-ray crystallographical technology are well known, and are not detailed here. The X-ray beam is applied by the X-ray generator 7 to the lower face (inspected face) of the wafer W, and is reflected from the face. In the inspection assembly D of the present embodiment, the X-ray generator 7, the X-ray detector 8, and the wafer W are arranged such that the Bragg diffraction condition, which is the condition for the crystal reflect the X-ray beam with maximum intensity, is satisfied when the inspected surface of the semiconductor wafer has an off-angle of $4 \pm 1°$ in the $<100>$ direction, which is 45° from the OF, that is, the reflected X-ray beam of maximum intensity is detected by the X-ray detector 8 only if the 400 lattice plane forms an angle of from 3 to 5 degrees with the inspected surface of the semiconductor wafer. Therefore, it is possible to determine whether or not the right face of the wafer W is being X-rayed, and whether or not the off-angle of the wafer W is in the permissible range of 3° to 5° based on whether or not the x-ray detector 8 is receiving the reflected X-ray beam. In other words, if the X-ray detector 8 does not detect the incoming X-ray beam, it is determined that either the wrong face of the wafer W is being X-rayed or the off-angle of the wafer W is outside the permissible range. During the inspection, the data taken by the X-ray detector 8 are stored (step 34).

When the above inspection is completed (step 35), the shutter of the X-ray generator 7 is closed (step 36). Then, the robot 10 of the unloader assembly E advances its arm 15 toward the wafer W on the inspection stage (step 37), and the wafer sucker at the arm end is pneumatically connected to the vacuum suction means (step 38), and the inspection stage is disconnected from the vacuum suction means (step 39) whereby the wafer W is snatched by the robot 10 from the inspection stage of the inspection assembly D. Then, the arm 15 is withdrawn (step 40) and swung through an angle determined based on the information received from a data processing unit such as the result of the facial discrimination (OK or NG), the ordinal number of the wafer W, the designated store address of the wafer W, etc. (step 41). As a result of this swinging motion of the arm 15, the wafer W is brought close to one of the five cassettes 11. Then, it is determined whether or not the result of the facial discrimination is OK, that is, whether the right face of the wafer W was inspected (step 42), and if the answer is negative, the arm 15 overturns the wafer W (step 43), and if the answer is affirmative, the arm does not overturn the wafer W.

Thereafter, the robot 10 advances its arm 15 toward the designated cassette to which the arm 15 is directed, and inserts the waver W in the cassette (step 44), and the arm 15 moves vertically till the designated rack of the cassette is reached, and the wafer W is set in the designated rack of the designated address (step 45), whereupon the arm 15 is disconnected from the vacuum suction means (step 46) and the robot 10 withdraws the arm 15 from the cassette 11 leaving the wafer W in the rack (step 47). Thus, the procedure of conducting the facial discrimination and the crystal orientation determination of the wafer W is completed (END).

In the present embodiment, the above program for conducting the facial discrimination and the determination of the crystal orientation is executed automatically and continuously with all of the semiconductor wafers W stored in the cassettes 4 on the turn table 2 (125 wafers), so that no wafer is brought into the later process without being inspected for crystal orientation and facial orientation. Thus the occurrence of out-of-specification wafer is greatly reduced.

The semiconductor wafer orientation examining and determining apparatus 1 of the above embodiment is employed in a wafer manufacturing process. Next, with reference to FIG. 4, a semiconductor wafer orientation examining and determining apparatus employed in the inspection process will be described. Incidentally, in FIG. 4 those parts that are of the similar construction and function as their counterparts in FIG. 1 are given the same reference numerals for simplicity.

Figure 4:
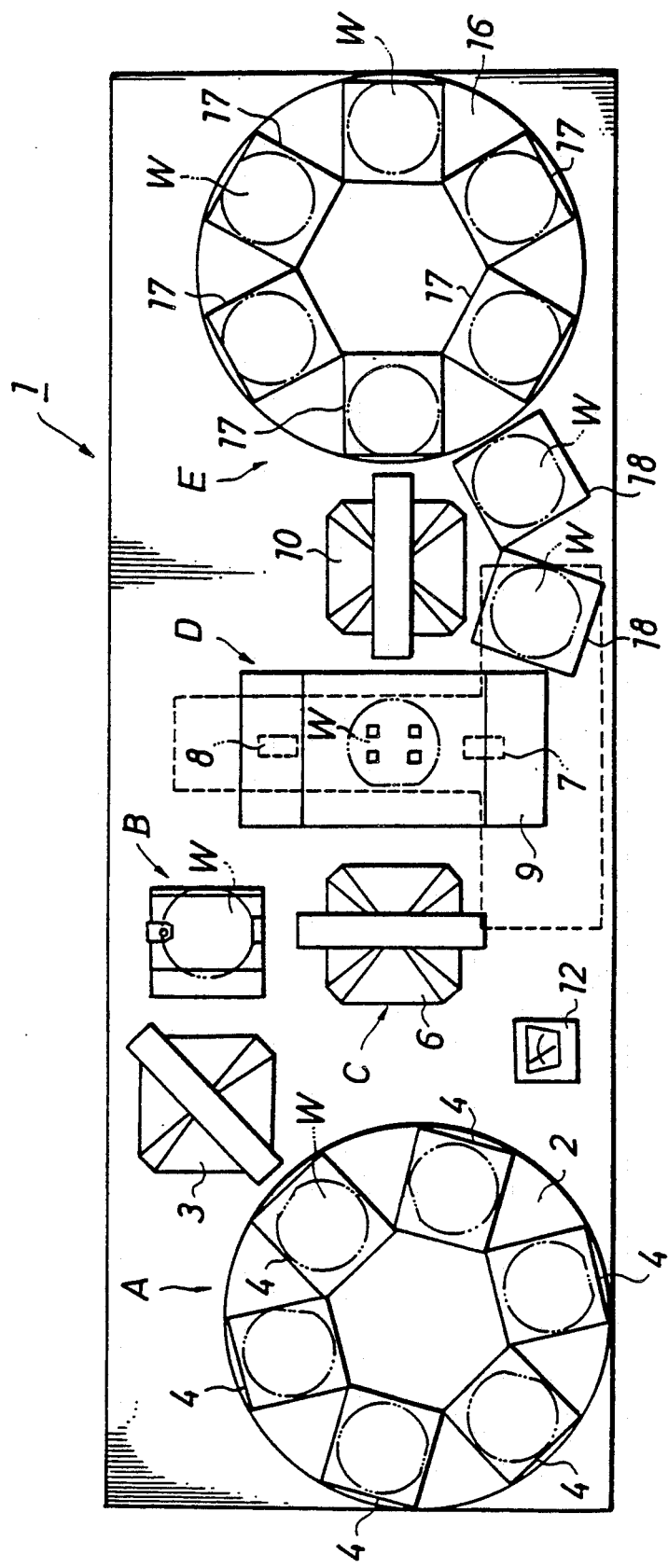
FIG. 4 is a plan view of another embodiment of the single crystal orientation identifying and determining apparatus for semiconductor wafer, according to the present invention.

In the semiconductor wafer orientation examining and determining apparatus 1 of FIG. 4, only the unloader assembly E is of different configuration from the counterpart assembly in the apparatus of FIG. 1, and is composed of a robot 10, a turn table 16, six cassettes 17 (for storing only the OK wafers whose upside face is polished) provided on the turn table 16, and two cassettes 18 (for storing only the NG wafers whose downside face is polished).

Therefore, in the second embodiment of the apparatus 1 (FIG. 4), the polished wafers W are oriented and inspected in the same manners as in the firs embodiment of the apparatus 1 (FIG. 1), but the NG wafers are sorted out and stored in the different cassettes 18 than those 17 for storing the OK wafers.

Although the present invention has been described and illustrated in detail it is understood that the same is by way of illustration and example only and is not to be taken by way of limitation, the spirit and scope of the present invention being limited only by the terms of the appended claims.

We claim:

1. A single crystal orientation identifying and determining apparatus for semiconductor wafers capable of conducting the facial discrimination of a semiconductor wafer and the determination of the crystal orientation thereof, which comprises:
    a first wafer store means for storing wafers at different addresses,
    an alignment means for aligning the wafer in a predetermined orientation,
    an X-ray inspection means for inspecting the wafer as to whether or not the inspected face of the wafer is a predetermined particular face, and whether or not the orientation of the principal plane of the wafer is within a predetermined range, said X-ray inspection means including an X-ray generator, an X-ray detector, and an X-ray inspection stage,
    a second wafer store means for storing X-ray inspected wafers at different addresses,
    a first conveyor means for conveying the wafer from the first wafer store means to the alignment means,
    a second conveyor means for conveying the wafer from the alignment means to the X-ray inspection means, and
    a third conveyor means for conveying the wafer from the X-ray inspection means to an arbitrary address in the second wafer store means determined based on the result of the X-ray inspection and the wafer's addressing the first wafer store means.

2. A single crystal orientation identifying and determining apparatus in accordance with claim 1, wherein the third conveyor means is adapted to overturn the wafer before conveying the wafer to the destination address in the second wafer store means if it is determined as a result of the inspection by the X-ray inspection means that a predetermined particular face of the wafer is not X-rayed.

3. A single crystal orientation identifying and determining apparatus in accordance with claim 1, wherein the second wafer store means consists of two groups of addresses, the first group for storing those wafers whose predetermined particular faces are X-rayed, and the second group for storing those wafers those other faces are X-rayed.

4. A single crystal orientation identifying and determining apparatus in accordance with claim 1, wherein the apparatus is designed to inspect the semiconductor wafer W provided with an orientation flat, and the alignment means is an orientation flat alignment means adapted to align the wafer in a predetermined orientation with the help of the orientation flat.

5. A single crystal orientation identifying and determining apparatus in accordance with any one of claims 1 through 4, wherein the X-ray inspection means is adapted to inspect whether the angle made between the principal crystal plane and the 100 crystal plane is from 3 to 5 degrees.

6. A method for operating a single crystal orientation identifying and determining apparatus for semiconductor wafers of claim 1 comprising the steps of:

conveying a wafer from the first wafer store means to the alignment means by means of the first conveyor means;
aligning the wafer in a predetermined orientation by means of the alignment means;
conveying the wafer from the alignment means to the X-ray inspection means by means of the second conveyor means;
conducting X-ray inspection on the wafer by means of the X-ray inspection means;
conveying the wafer from the X-ray inspection means to the second wafer store means by means of the third conveyor means; and
storing the wafer at an address determined by the results of the X-ray inspection and the original address of the wafer at the first wafer store means.

7. A method for operating a single crystal orientation identifying and determining apparatus for semiconductor wafers of claim 2 comprising the steps of:
conveying a wafer from the first wafer store means to the alignment means by means of the first conveyor means;
aligning the wafer in a predetermined orientation by means of the alignment means;
conveying the wafer from the alignment means to the X-ray inspection means by means of the second conveyor means;
conducting X-ray inspection on the wafer including the determination as to whether or not a predetermined particular face of the wafer is X-rayed by means of the X-ray inspection means;
conveying the wafer from the X-ray inspection means to the second wafer store means by means of the third conveyor means;
overturning the wafer if it is determined as a result of the X-ray inspection that the X-rayed face of the wafer is not the predetermined particular face; and
storing the wafer at an address determined by the results of the X-ray inspection and the original address of the wafer at the first wafer store means.

8. A method for operating a single crystal orientation identifying and determining apparatus for semiconductor wafers of claim 3 comprising the steps of:
conveying a wafer from the first wafer store means to the alignment means by means of the first conveyor means;
aligning the wafer in a predetermined orientation by means of the alignment means;
conveying the wafer from the alignment means to the X-ray inspection means by means of the second conveyor means;
conducting X-ray inspection on the wafer including the determination as to whether or not a predetermined particular face of the wafer is X-rayed by means of the X-ray inspection means;
conveying the wafer from the X-ray inspection means to the second wafer store means by means of the third conveyor means and
storing the wafer at an address belonging to the first group if it is determined that as a result of the X-ray inspection the X-rayed face of the wafer is the predetermined particular face, and storing the wafer at an address belonging to the second group if it is determined that the X-rayed face of the wafer is not the predetermined particular face.

* * * * *